(12) United States Patent
Simsek-Ege et al.

(10) Patent No.: US 10,553,703 B2
(45) Date of Patent: Feb. 4, 2020

(54) ARRAY OF ELEVATIONALLY-EXTENDING TRANSISTORS AND A METHOD USED IN FORMING AN ARRAY OF ELEVATIONALLY-EXTENDING TRANSISTORS

(71) Applicant: Micron Technology, Inc., Boise, ID (US)

(72) Inventors: Fatma Arzum Simsek-Ege, Boise, ID (US); Diem Thy N. Tran, Garden City, ID (US)

(73) Assignee: Micron Technology, Inc., Boise, ID (US)

( * ) Notice: Subject to any disclaimer, the term of this patent is extended or adjusted under 35 U.S.C. 154(b) by 185 days.

(21) Appl. No.: 15/900,537

(22) Filed: Feb. 20, 2018

(65) Prior Publication Data

US 2018/0337258 A1 Nov. 22, 2018

Related U.S. Application Data

(60) Provisional application No. 62/508,935, filed on May 19, 2017.

(51) Int. Cl.
| | |
|---|---|
| *H01L 21/8239* | (2006.01) |
| *H01L 29/66* | (2006.01) |
| *H01L 21/8234* | (2006.01) |
| *H01L 21/02* | (2006.01) |
| *H01L 27/1159* | (2017.01) |
| *H01L 27/11597* | (2017.01) |
| *H01L 27/11568* | (2017.01) |
| *H01L 27/11582* | (2017.01) |
| *H01L 27/108* | (2006.01) |

(52) U.S. Cl.
CPC .. *H01L 29/66666* (2013.01); *H01L 21/02323* (2013.01); *H01L 21/823487* (2013.01); *H01L 27/1159* (2013.01); *H01L 27/11568* (2013.01); *H01L 27/11582* (2013.01); *H01L 27/11597* (2013.01); *H01L 29/66545* (2013.01); *H01L 27/10873* (2013.01)

(58) Field of Classification Search
CPC ......... H01L 29/66666; H01L 29/66545; H01L 21/02323; H01L 21/823487; H01L 27/10873; H01L 27/11597; H01L 27/1159; H01L 27/11582; H01L 27/11568
See application file for complete search history.

(56) References Cited

U.S. PATENT DOCUMENTS

2011/0012182 A1* 1/2011 Tang ................. H01L 27/10823
257/296

* cited by examiner

*Primary Examiner* — Joseph C. Nicely
*Assistant Examiner* — Pavel G Ivanov
(74) *Attorney, Agent, or Firm* — Wells St. John P.S.

(57) ABSTRACT

A method used in forming an array of elevationally-extending transistors comprises forming spaced lower conductive lines over a substrate. A gate insulator is formed in openings that are individually directly above individual of the lower conductive lines. The openings are formed into laterally-spaced lines comprising sacrificial material and are spaced longitudinally there-along. Channel material is formed in the individual openings laterally adjacent the gate insulator and is electrically coupled to the individual lower conductive line there-below. The sacrificial material is replaced with conductive-gate material. Other methods are disclosed including arrays of elevationally-extending transistors independent of method of manufacture.

16 Claims, 13 Drawing Sheets

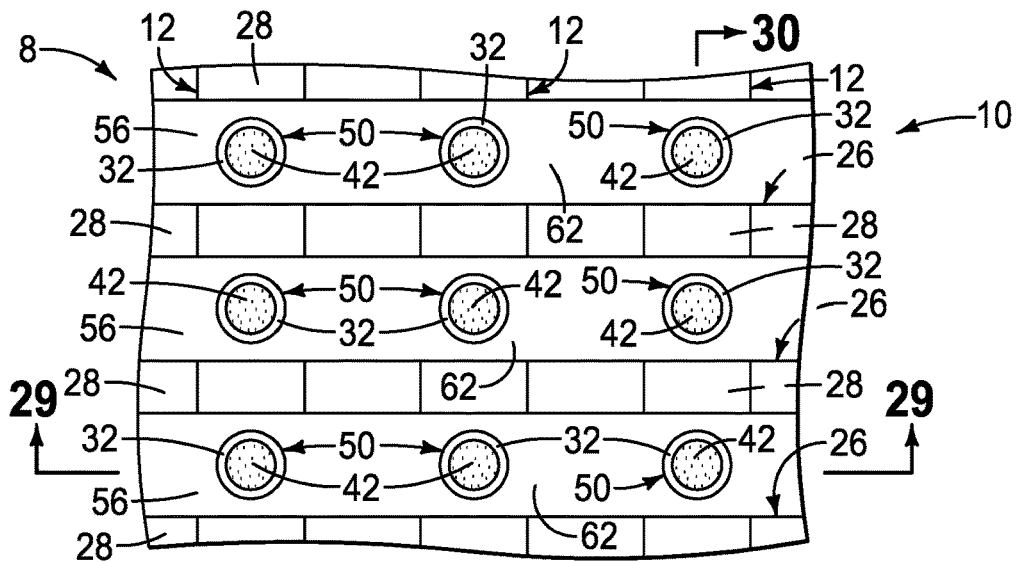
FIG. 28
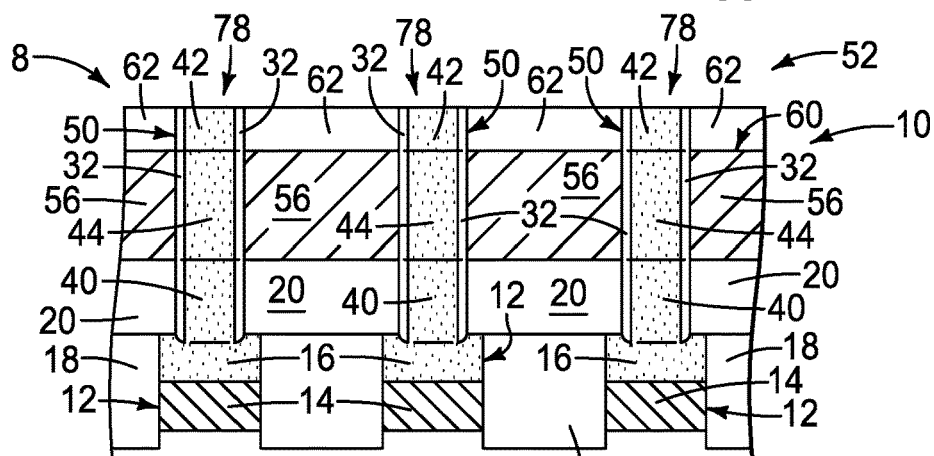
FIG. 29
FIG. 30

ARRAY OF ELEVATIONALLY-EXTENDING TRANSISTORS AND A METHOD USED IN FORMING AN ARRAY OF ELEVATIONALLY-EXTENDING TRANSISTORS

TECHNICAL FIELD

Embodiments disclosed herein pertain to arrays of elevationally-extending transistors and to methods used in forming an array of elevationally-extending transistors.

BACKGROUND

Memory is one type of integrated circuitry, and is used in computer systems for storing data. Memory may be fabricated in one or more arrays of individual memory cells. Memory cells may be written to, or read from, using digit lines (which may also be referred to as bit lines, data lines, or sense lines) and access lines (which may also be referred to as word lines). The sense lines may conductively interconnect memory cells along columns of the array, and the access lines may conductively interconnect memory cells along rows of the array. Each memory cell may be uniquely addressed through the combination of a sense line and an access line.

Memory cells may be volatile, semi-volatile, or nonvolatile. Nonvolatile memory cells can store data for extended periods of time in the absence of power. Nonvolatile memory is conventionally specified to be memory having a retention time of at least about 10 years. Volatile memory dissipates, and is therefore refreshed/rewritten to maintain data storage. Volatile memory may have a retention time of milliseconds or less. Regardless, memory cells are configured to retain or store memory in at least two different selectable states. In a binary system, the states are considered as either a "0" or a "1". In other systems, at least some individual memory cells may be configured to store more than two levels or states of information.

A field effect transistor is one type of electronic component that may be used in a memory cell. These transistors comprise a pair of source/drain regions having a semiconductive channel region there-between. A conductive gate is adjacent the channel region and separated there-from by a thin gate insulator. Application of a suitable voltage to the gate allows current to flow from one of the source/drain regions to the other through the channel region. When the voltage is removed from the gate, current is largely prevented from flowing through the channel region. Field effect transistors may also include additional structure, for example reversibly programmable charge storage/trap regions as part of the gate construction between the gate insulator and the conductive gate. Transistors other than field effect transistors, for example bipolar transistors, may additionally or alternately be used in memory cells. Transistors may be used in many types of memory. Further, transistors may be used and formed in arrays other than memory.

BRIEF DESCRIPTION OF THE DRAWINGS

FIG. 28 is a view of the FIG. 25 substrate at a processing step subsequent to that shown by FIG. 24.

FIG. 29 is a sectional view taken through line 29-29 in FIG. 28.

FIG. 30 is a sectional view taken through line 30-30 in FIG. 28.

DETAILED DESCRIPTION OF EXAMPLE EMBODIMENTS

Embodiments of the invention encompass methods used in forming an array of elevationally-extending transistors and arrays of elevationally-extending transistors independent of method of manufacture. Method embodiments are initially described with reference to FIGS. 1-30.

Figure 1:
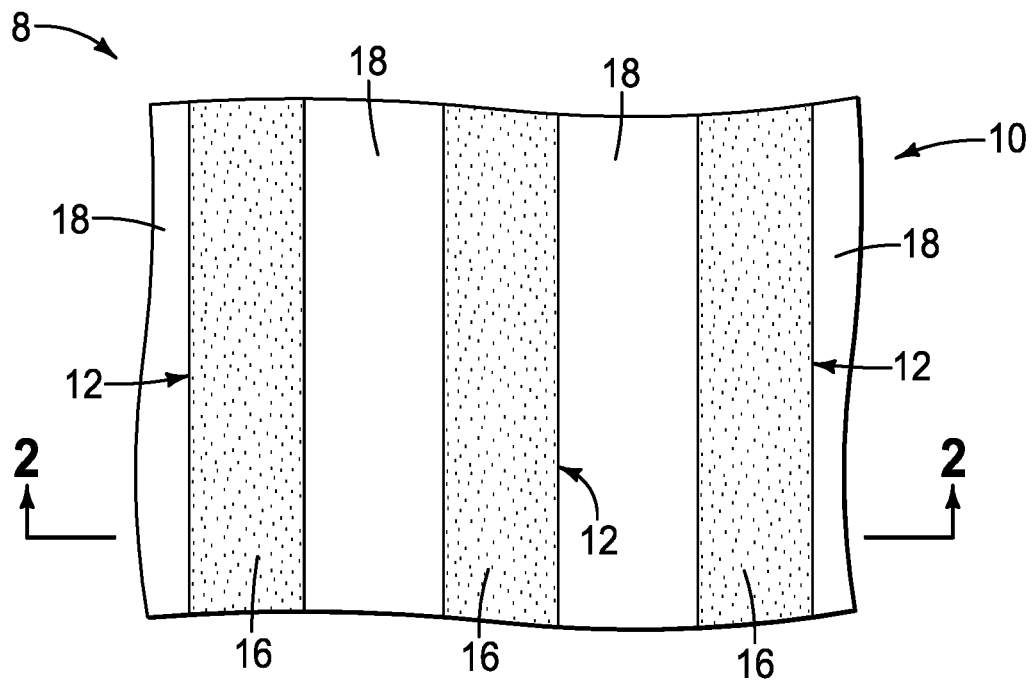
FIG. 1 is a diagrammatic top view of a substrate fragment in process in accordance with an embodiment of the invention.
Figure 2:
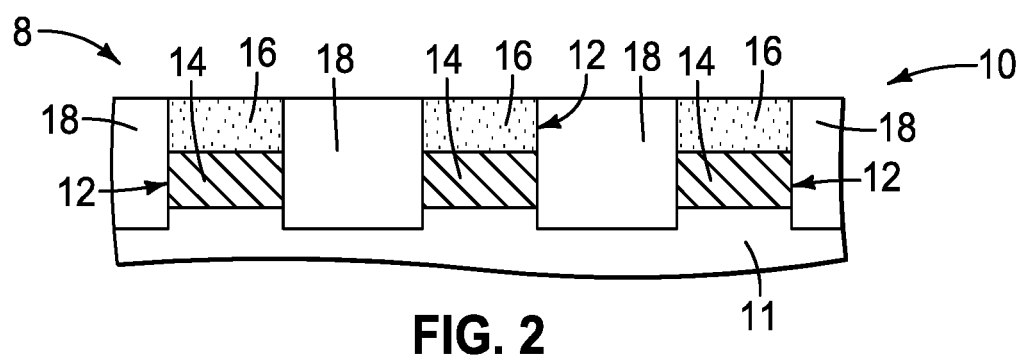
FIG. 2 is a sectional view taken through line 2-2 in FIG. 1.

Referring to FIGS. 1 and 2, an example fragment of a substrate construction 8 comprises an array or array area 10 that will comprise elevationally-extending transistors fabricated relative to a base substrate 11. Such transistors may be formed as part of a memory array or may not be part of a memory array. Substrate 11 may comprise any one or more of conductive/conductor/conducting (i.e., electrically herein), semiconductive/semiconductor/semiconducting, and insulative/insulator/insulating (i.e., electrically herein) materials. Various materials have been formed elevationally over base substrate 11. Materials may be aside, elevationally inward, or elevationally outward of the FIGS. 1 and 2-depicted materials. For example, other partially or wholly fabricated components of integrated circuitry may be provided somewhere above, about, or within base substrate 11. Control and/or other peripheral circuitry for operating components within the memory array may also be fabricated, and may or may not be wholly or partially within a memory array or sub-array. Further, multiple sub-arrays may also be fabricated and operated independently, in tandem, or otherwise relative one another. As used in this document, a "sub-array" may also be considered as an array.

Spaced lower conductive lines 12 ("lower" referring to elevation) have been formed over substrate 11. In one embodiment, such individually comprise, consist essentially of, or consist of conductively-doped-semiconductive material 16 (e.g., polysilicon sufficiently doped with conductivity-modifying impurity such that material 16 is conductive) extending longitudinally along individual of lower conductive lines 12 above metal material 14 (e.g., TiN, WN, $WSi_x$, and/or W) that extends longitudinally along individual lower conductive lines 12. In one embodiment and as shown, conductively-doped-semiconductive material 16 is formed directly against (and is thereby directly electrically coupled to) metal material 14. Insulative material 18 (e.g., silicon nitride, doped or undoped silicon dioxide, and/or a gas [e.g. an air gap]) is between lower conductive lines 12. Lower conductive lines 12 may be fabricated using any suitable technique(s), for example using subtractive photolithographic patterning and etch with or without pitch multiplication. Insulative material 18 may then be deposited to fill space between lower conductive lines 12 and, for example, planarized back at least to elevationally-outermost surfaces of lower conductive lines 12 as shown. An example maximum width and an example maximum thickness for each of materials 14 and 16 is about 10 nanometers (nm) to 50 nm.

Figure 3:
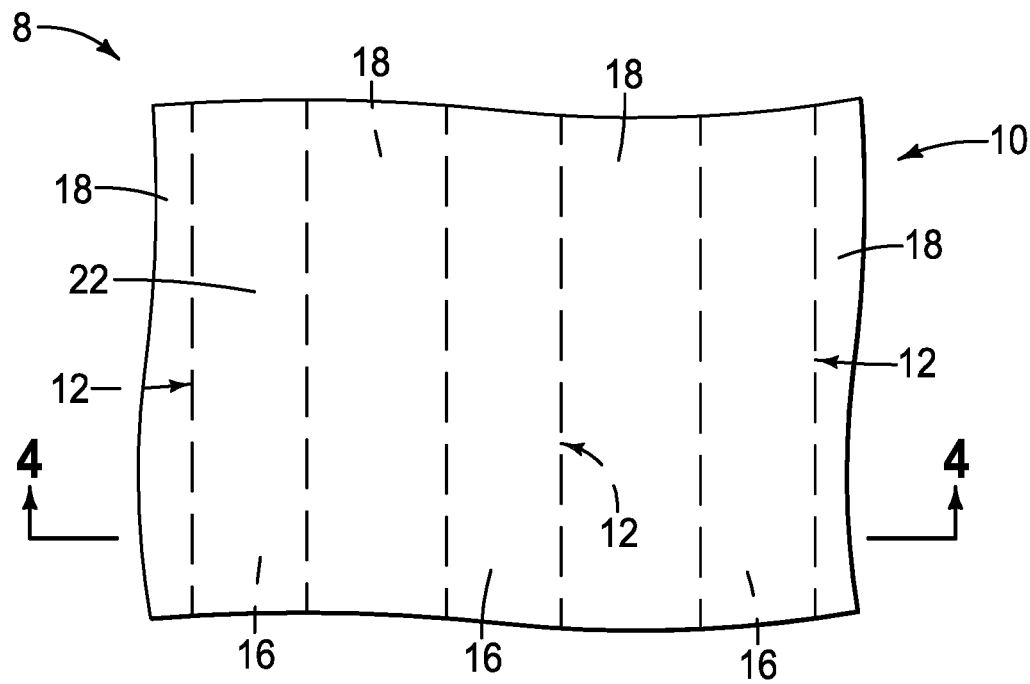
FIG. 3 is view of the FIG. 1 substrate at a processing step subsequent to that shown by FIG. 1.
Figure 4:
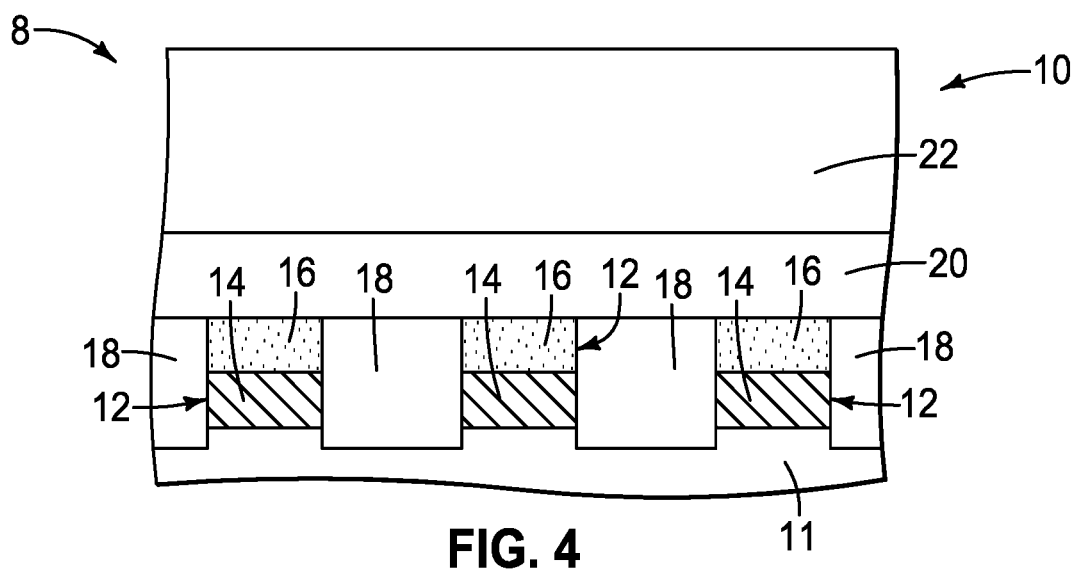
FIG. 4 is a sectional view taken through line 4-4 in FIG. 3.
Figure 5:
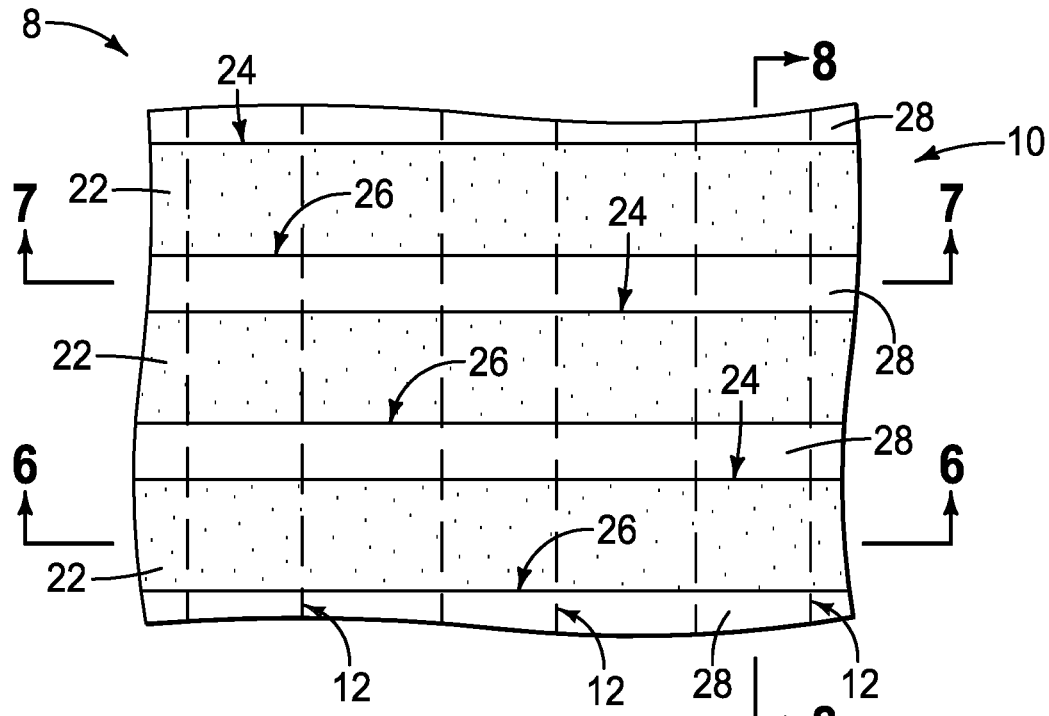
FIG. 5 is view of the FIG. 3 substrate at a processing step subsequent to that shown by FIG. 3.
Figure 6:
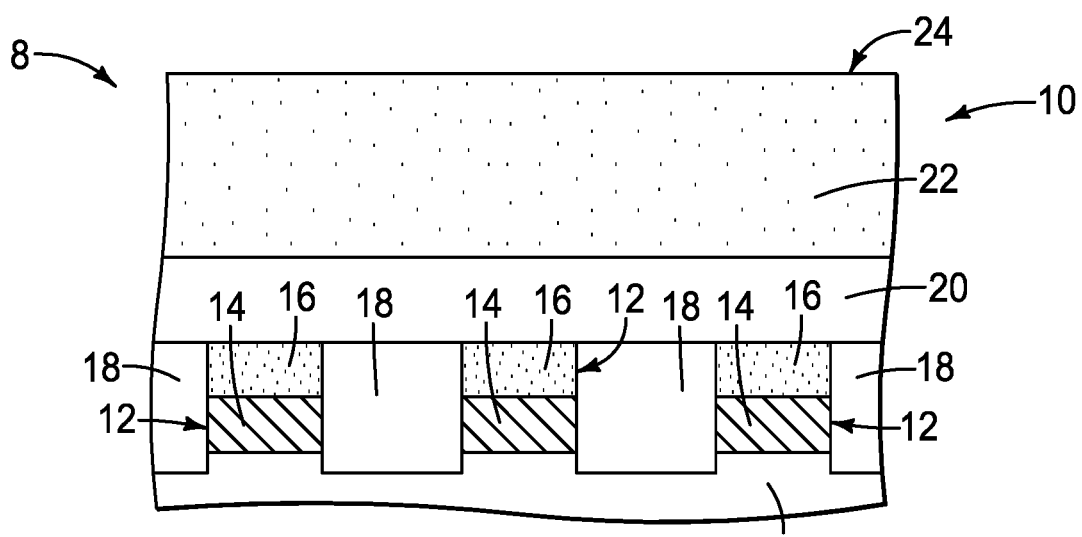
FIG. 6 is a sectional view taken through line 6-6 in FIG. 5.
Figure 7:
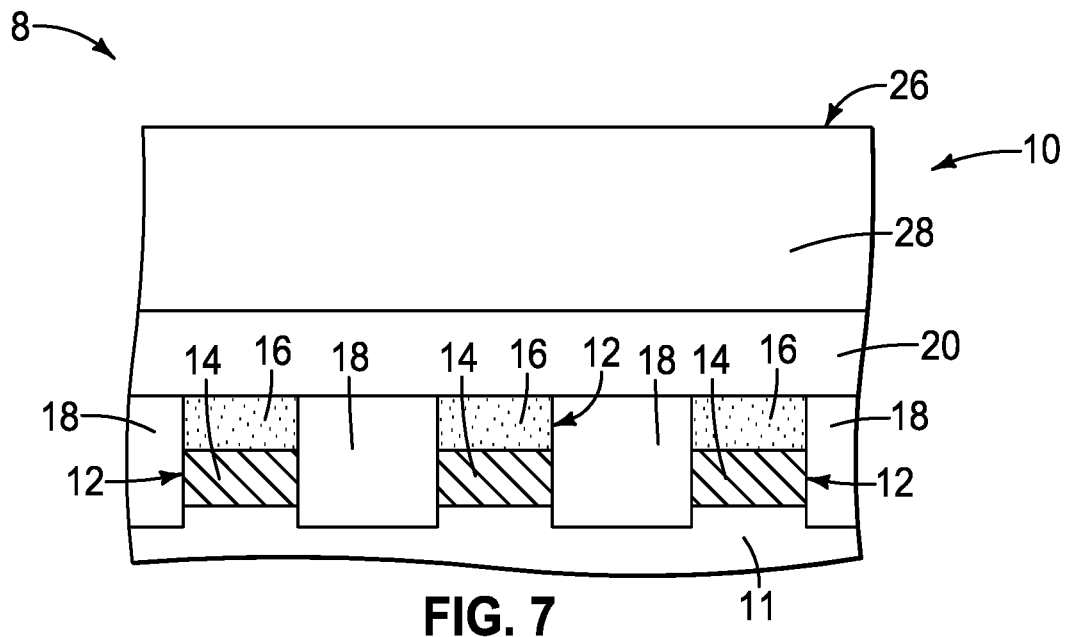
FIG. 7 is a sectional view taken through line 7-7 in FIG. 5.
Figure 8:
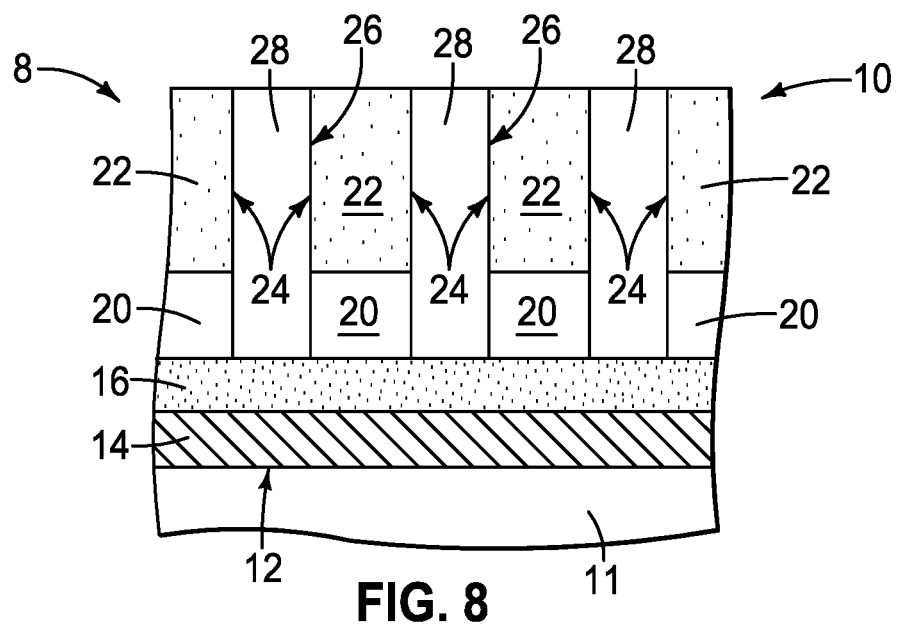
FIG. 8 is a sectional view taken through line 8-8 in FIG. 5.

Referring to FIGS. 3 and 4, and in one embodiment, insulative material 20 (e.g., silicon nitride and/or doped or undoped silicon dioxide) has been formed atop lower conductive lines 12 and insulative material 18. Insulative material 20 may be of the same or different composition as that of insulative material 18, and an example thickness is about 5 nm to 60 nm. Sacrificial material 22 has been formed above insulative material 20/18. All of sacrificial material 22 may be removed subsequently as described below, or some of such may remain in a finished circuitry construction. In one embodiment, sacrificial material 22 is insulative (e.g., silicon nitride), and in one embodiment is not insulative (i.e., being one or both of semiconductive or conductive). Regardless, an example thickness is about 100 nm to 300 nm.

Referring to FIGS. 5-8, sacrificial material 22 has been formed into spaced sacrificial-material lines 24 above insulative material 20, 18, with sacrificial-material lines 24 crossing above lower conductive lines 12. Such may be formed using any suitable technique(s), for example those described above for forming lower conductive lines 12 and with or without pitch multiplication. In one embodiment and as shown, longitudinally-extending trenches 26 have been formed between immediately-adjacent sacrificial-material lines 24 and insulator material 28 (e.g., silicon dioxide) has been formed therein. For example, insulator material 28 may be deposited to fill and overfill trenches 26, with insulative material 28 then being planarized back at least to elevationally-outermost surfaces of sacrificial-material lines 24. Insulator material 28 may be of the same or different composition from that of insulative material 20 and/or 18 (including being in whole or part a gas), and may be of different composition as that of sacrificial material 22. Lines 12 and 24 are shown as being straight-linear with lines 24 crossing orthogonally relative to lines 12, although any other crossing relationship(s) or construction(s) may be used.

Figure 9:
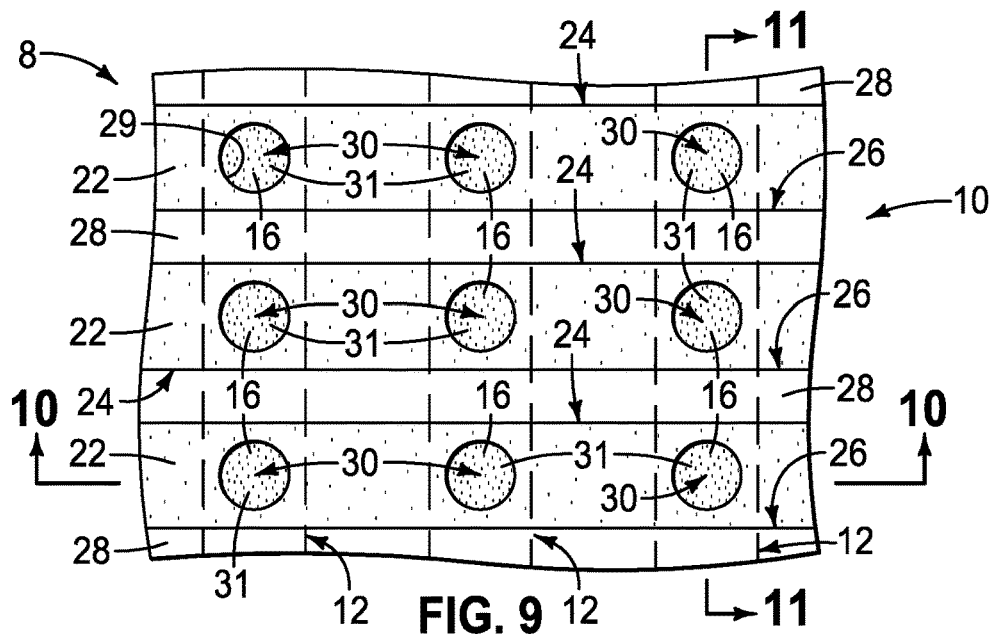
FIG. 9 is view of the FIG. 5 substrate at a processing step subsequent to that shown by FIG. 5.
Figure 10:
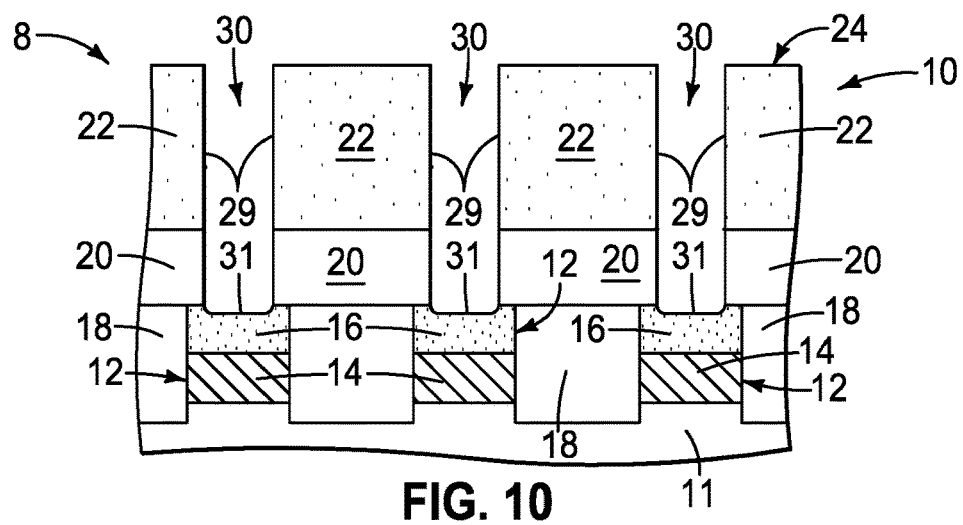
FIG. 10 is a sectional view taken through line 10-10 in FIG. 9.
Figure 11:
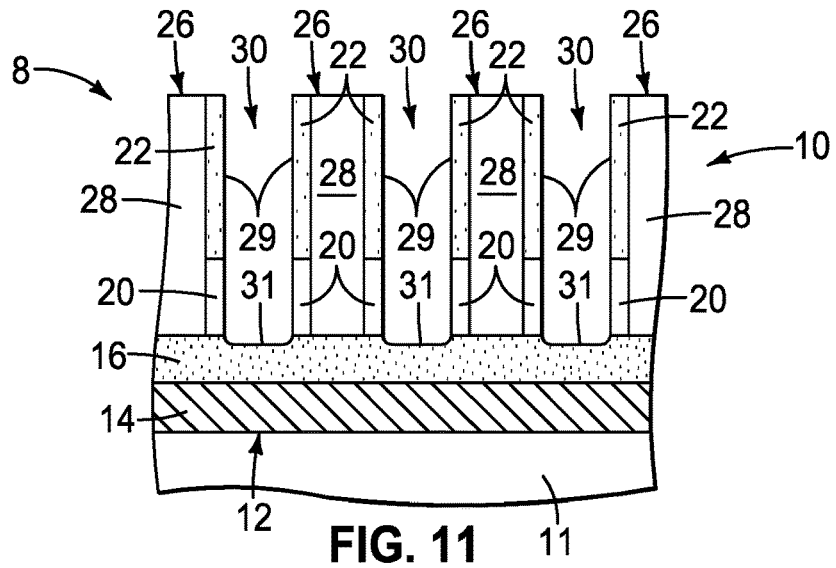
FIG. 11 is a sectional view taken through line 11-11 in FIG. 9.

Referring to FIGS. 9-11, openings 30 have been formed into sacrificial-material lines 24 directly above individual lower conductive lines 12 and are spaced longitudinally there-along. In one embodiment and as shown, openings 30 are formed through sacrificial-material lines 24 and through insulative material 20 to individual lower conductive lines 12 at this point in the method. In one embodiment and as shown, openings 30 are individually completely surrounded by sacrificial material 22 of individual sacrificial-material lines 24. Regardless, an example maximum open dimension (e.g., diameter) for openings 30 is about 15 nm to 50 nm. Individual openings 30 may be considered as comprising sidewalls 29 and a base 31.

Figure 12:
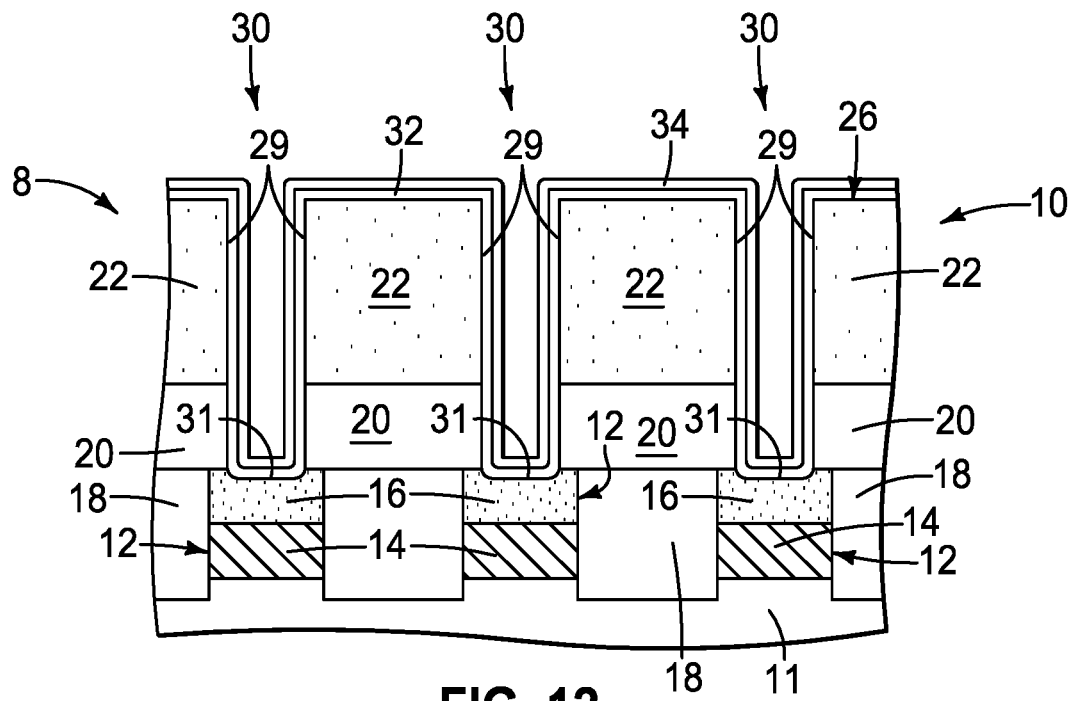
FIG. 12 is a view of the FIG. 10 substrate at a processing step subsequent to that shown by FIG. 10.
Figure 13:
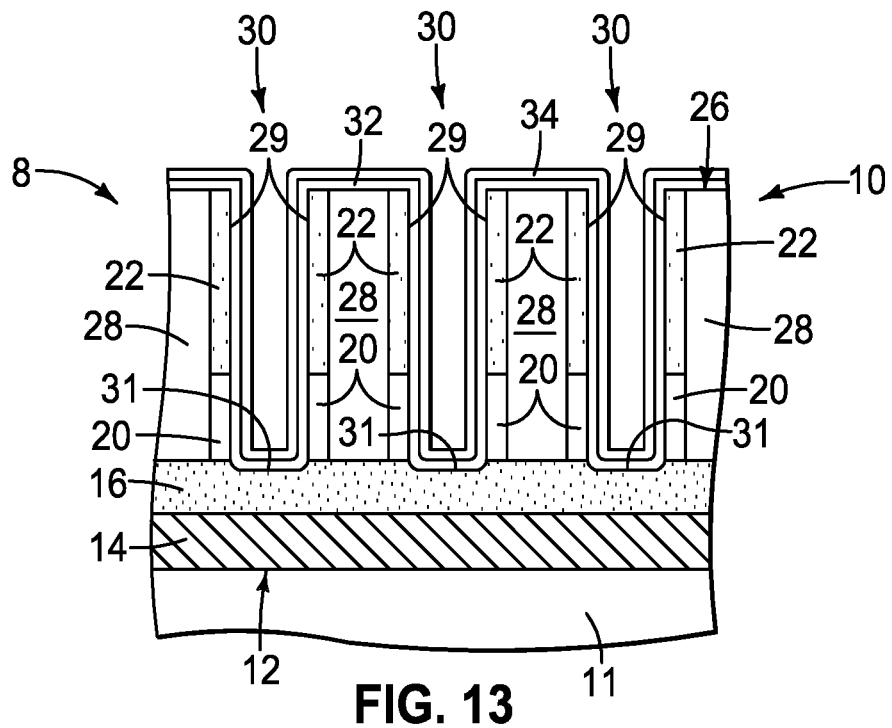
FIG. 13 is a view of the FIG. 11 substrate at a processing step subsequent to that shown by FIG. 11 and corresponds to that shown by FIG. 12.

Referring to FIGS. 12 and 13, a gate insulator 32 has been formed in individual openings 30 along sidewalls 29 and base 31. Example materials where the resultant elevationally-extending transistors do not retain a memory state are silicon dioxide and/or silicon nitride. Alternately, and by way of examples only, gate insulator 32 might comprise programmable material where, for example, threshold voltage of the transistor can be modified and stored in a non-volatile or semi-volatile manner. Any suitable existing or yet-to-be-developed programmable material(s) may be used (e.g., resistance-variable, ferroelectric, chalcogenide, phase change, memristive, etc.). Regardless, an example thickness for gate insulator 32 is 3 nm to 10 nm. In one embodiment and as shown, a sacrificial liner 34 has been formed within individual openings 30 laterally over inner sidewalls of and laterally across a base of gate insulator 32. Sacrificial liner 34, by way of example only, may be provided to protect gate insulator 32, with polysilicon being an example and an example thickness being 3 nm to 10 nm.

Figure 14:
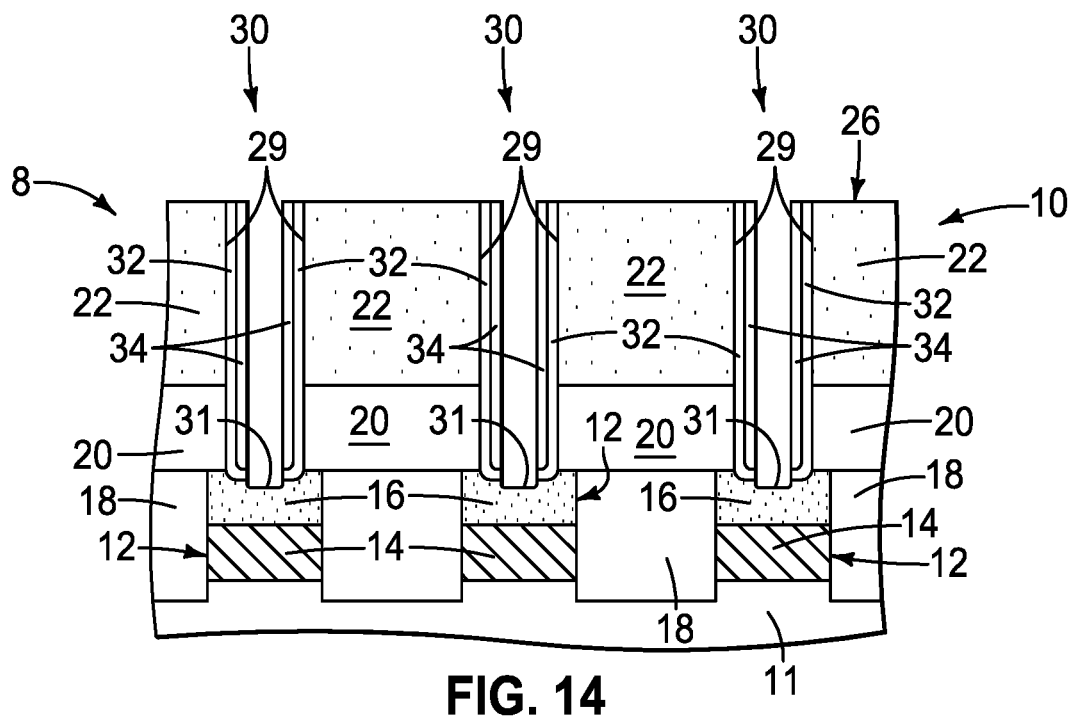
FIG. 14 is a view of the FIG. 12 substrate at a processing step subsequent to that shown by FIG. 12.
Figure 15:
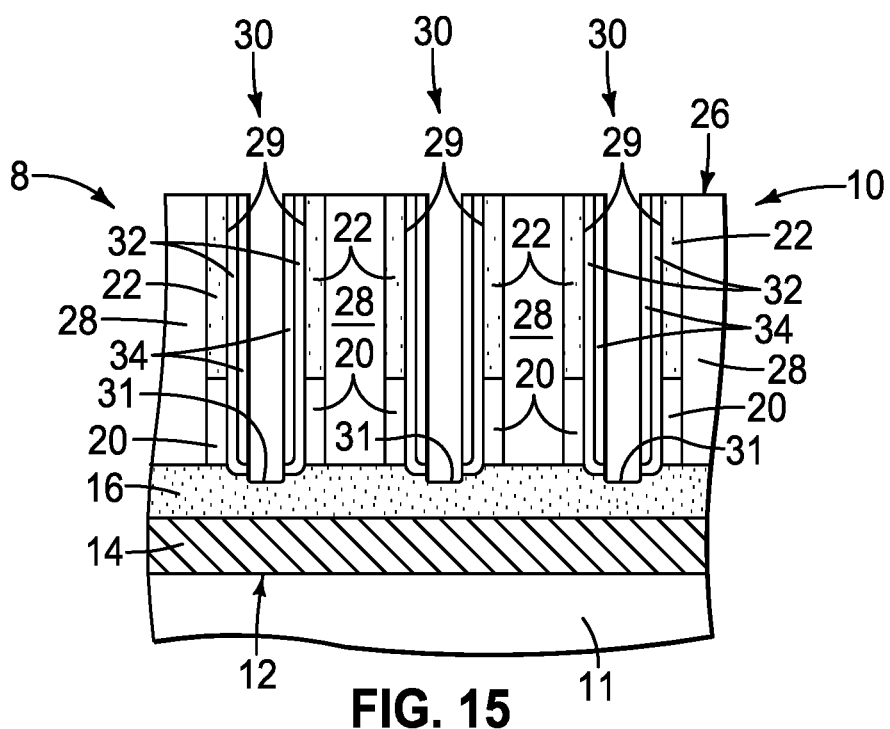
FIG. 15 is a view of the FIG. 13 substrate at a processing step subsequent to that shown by FIG. 13 and corresponds to that shown by FIG. 14.

Referring to FIGS. 14 and 15, etching has been conducted through a base of sacrificial liner 34 and the base of gate insulator 32 to individual lower conductive lines 12. An example technique for doing so is a dry anisotropic etch using $CH_4$ to etch through both a polysilicon liner 34 and an oxide gate insulator 32, and which also in one embodiment as shown, removes such from being over elevationally-outer surfaces of sacrificial material 22 and insulator material 28. Such may also etch into material 16 as shown.

Figure 16:
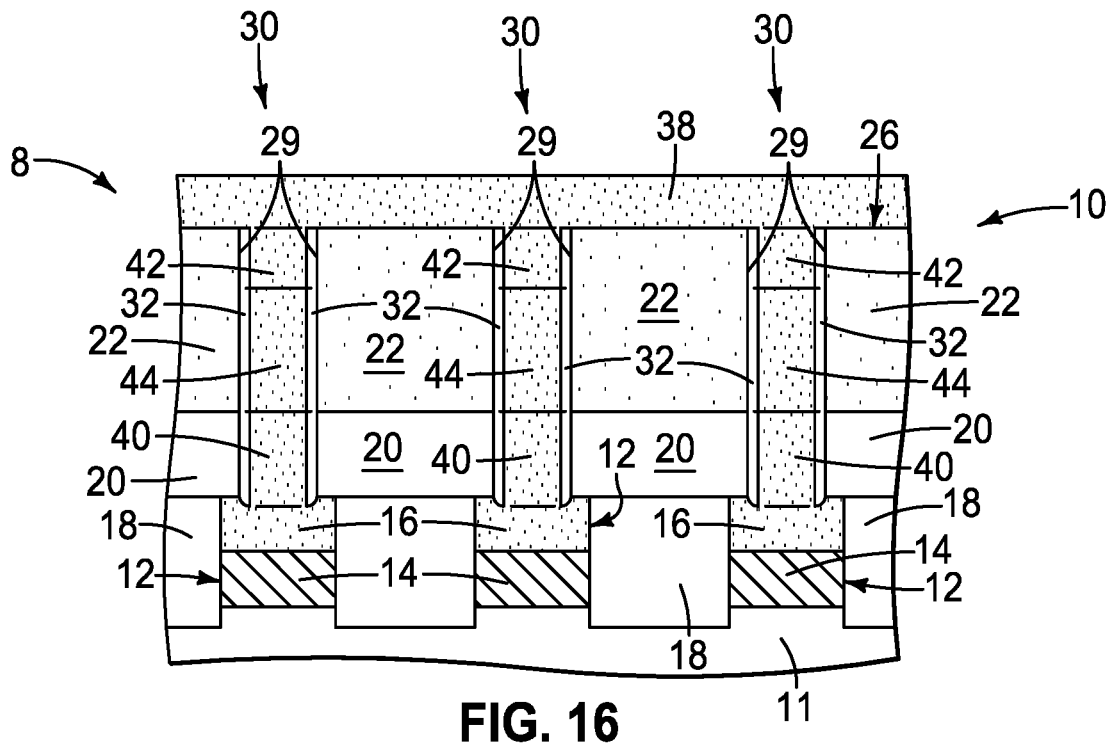
FIG. 16 is a view of the FIG. 14 substrate at a processing step subsequent to that shown by FIG. 14.
Figure 17:
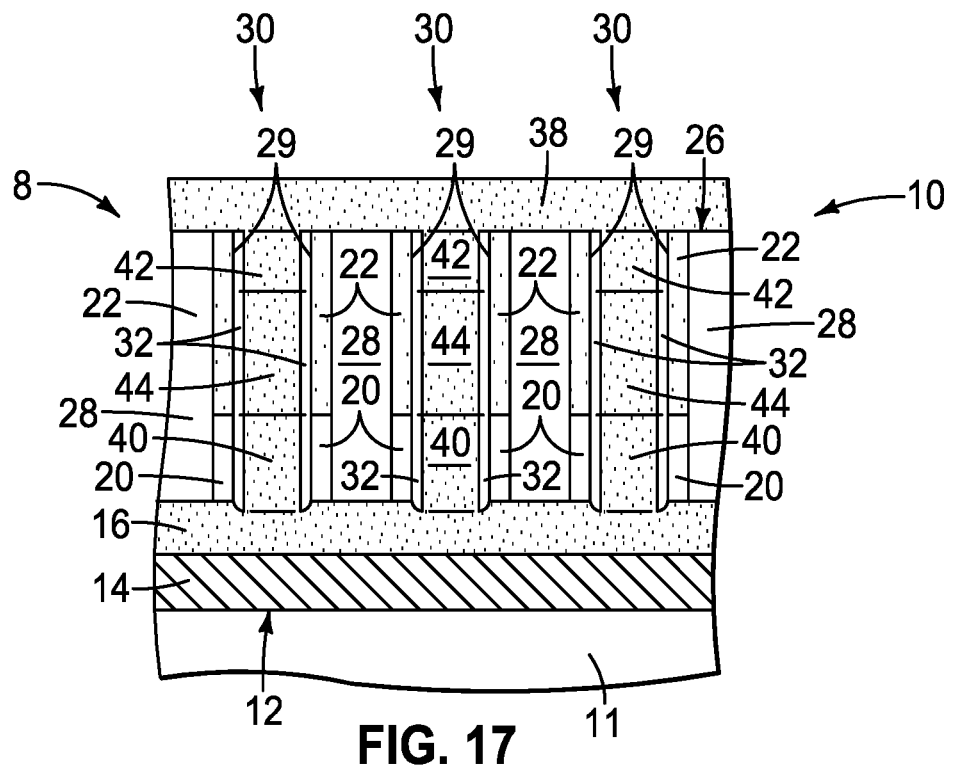
FIG. 17 is a view of the FIG. 15 substrate at a processing step subsequent to that shown by FIG. 15 and corresponds to that shown by FIG. 16.

Referring to FIGS. 16 and 17, sacrificial liner 34 (not shown) has been removed and transistor material 38 has been formed within openings 30, and in one embodiment as shown to fill and overfill such openings 30. Where, for example, sacrificial liner 34 (not shown) comprises polysilicon, such may be removed by exposure to tetra-methyl-ammonium-hydroxide. Example transistor material 38 is suitably-doped semiconductive material, for example suitably-doped polysilicon. Transistor material 38 as shown comprises a lower source/drain region-material 40 (e.g., 5 nm to 60 nm) that in one embodiment is directly electrically coupled to one of lower conductive lines 12, and in one embodiment as shown is directly against conductively-doped semiconductive material 16 of one of individual lower conductive lines 12. Transistor material 38 as shown also comprises an upper source/drain region or material 42 (e.g., 5 nm to 60 nm) and a channel region or material 44 (e.g., 10 nm to 150 nm) elevationally between upper source/drain region 42 and lower source/drain region 40. In one embodiment, lower source/drain region 40 comprises, consists essentially of, or consists of conductively-doped-semiconductive material, and in one such embodiment that is of the same composition as that of conductively-doped-semiconductive material 16 of lower conductive line 12. In one embodiment, upper source/drain region 42 comprises, consists essentially of, or consists of conductively-doped-semiconductive material. Alternately and by way of example only, upper source/drain region 42 and lower source/drain region 40 may comprise the same material and conductivity as channel region 44. Regardless, in one embodiment and as shown, channel material 44 is formed in individual openings 30 laterally adjacent gate insulator 32, in one embodiment directly against gate insulator 32, and is electrically coupled to an individual lower conductive line 12 there-below, for example through a lower source/drain region 40. In one embodiment, openings 30 are formed to extend to individual lower conductive lines 12 before forming gate insulator 32. In one embodiment, insulative material 20 is elevationally between sacrificial-material lines 24, with openings 30 extending into insulative material 20.

Figure 18:
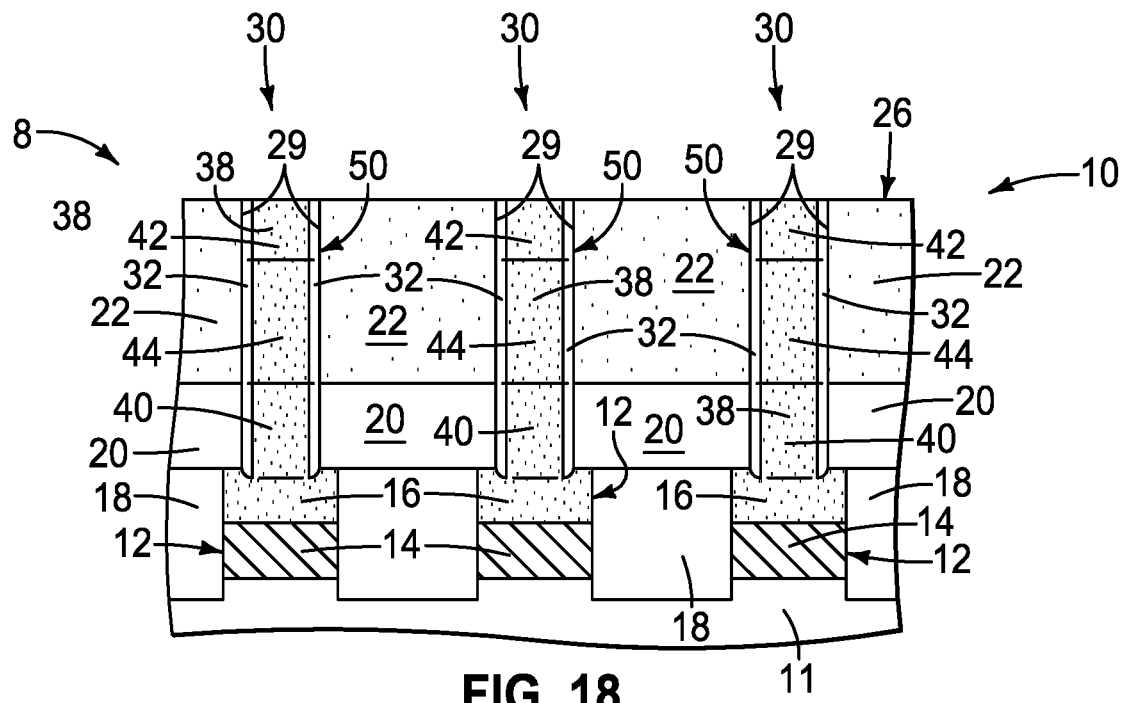
FIG. 18 is a view of the FIG. 16 substrate at a processing step subsequent to that shown by FIG. 16.
Figure 19:
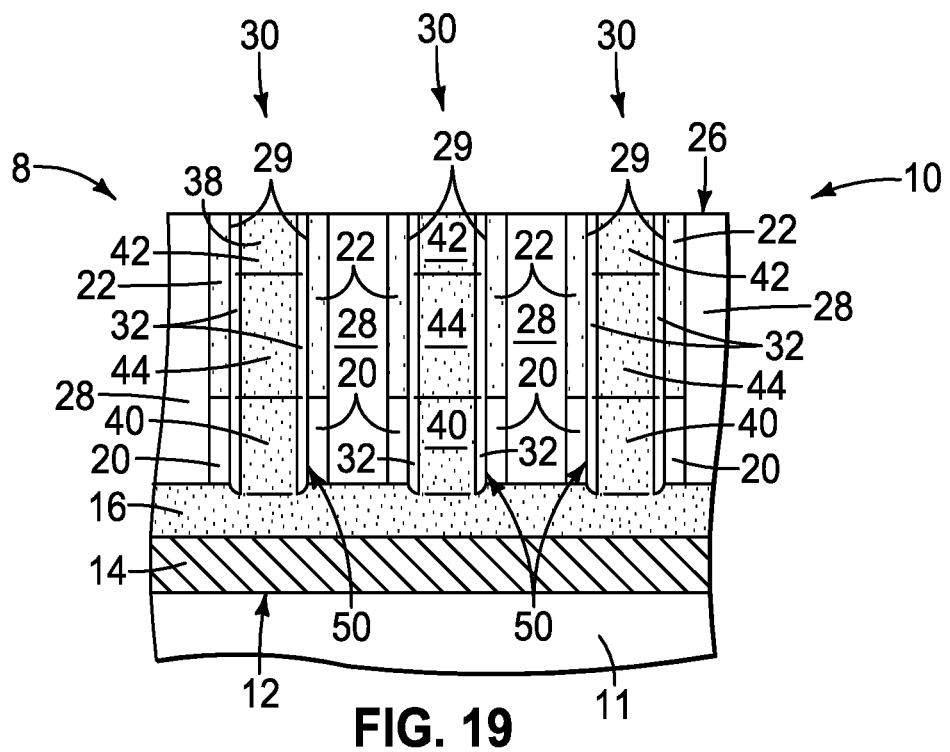
FIG. 19 is a view of the FIG. 17 substrate at a processing step subsequent to that shown by FIG. 17 and corresponds to that shown by FIG. 18.
Figure 20:
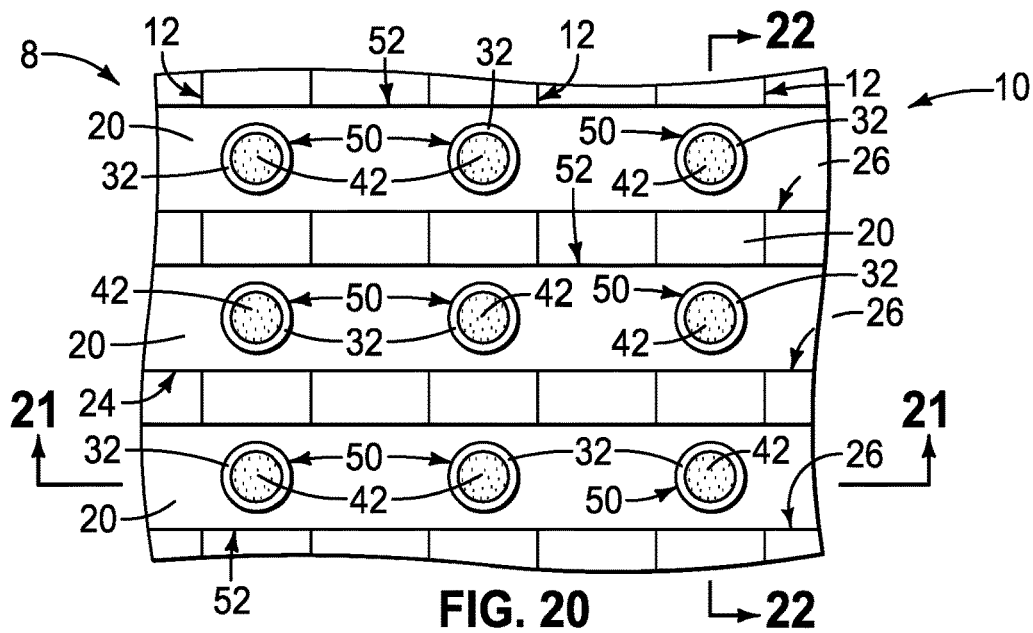
FIG. 20 is top view of the FIG. 18 substrate at a processing step subsequent to that shown by FIG. 18.
Figure 21:
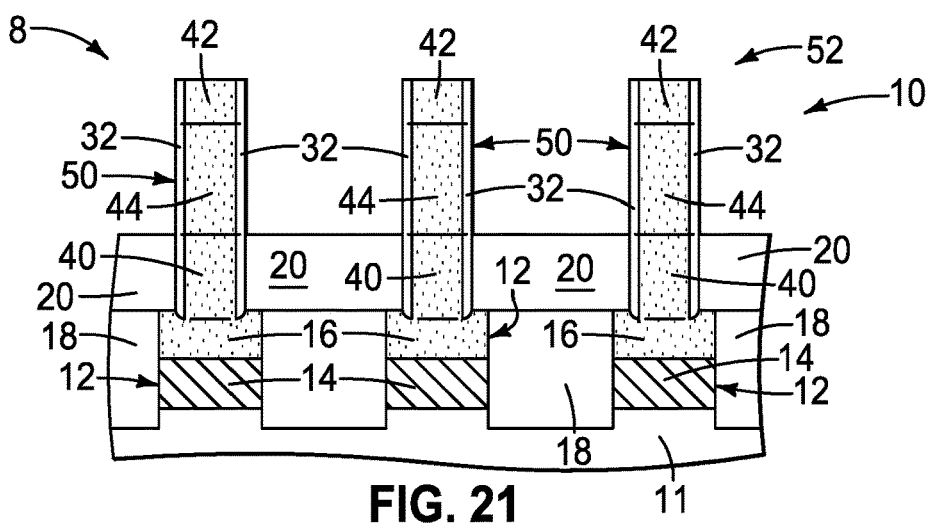
FIG. 21 is a sectional view taken through line 21-21 in FIG. 20.
Figure 22:
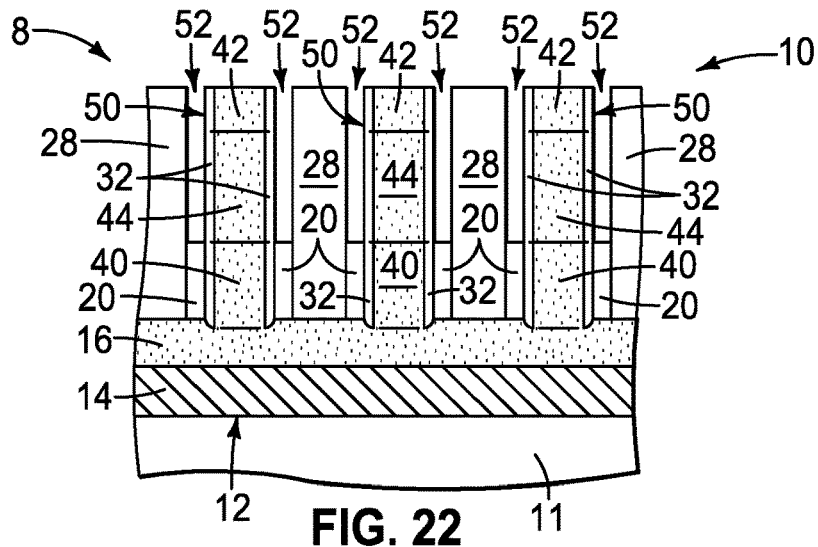
FIG. 22 is a sectional view taken through line 22-22 in FIG. 20.
Figure 23:
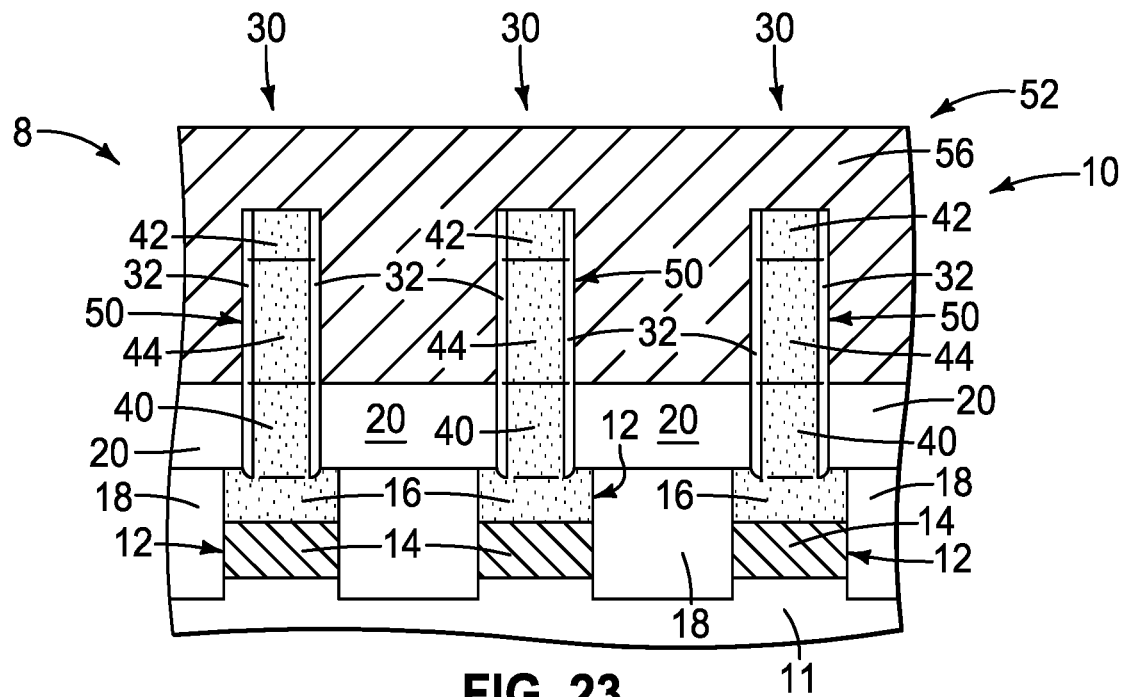
FIG. 23 is a view of the FIG. 21 substrate at a processing step subsequent to that shown by FIG. 21.
Figure 24:
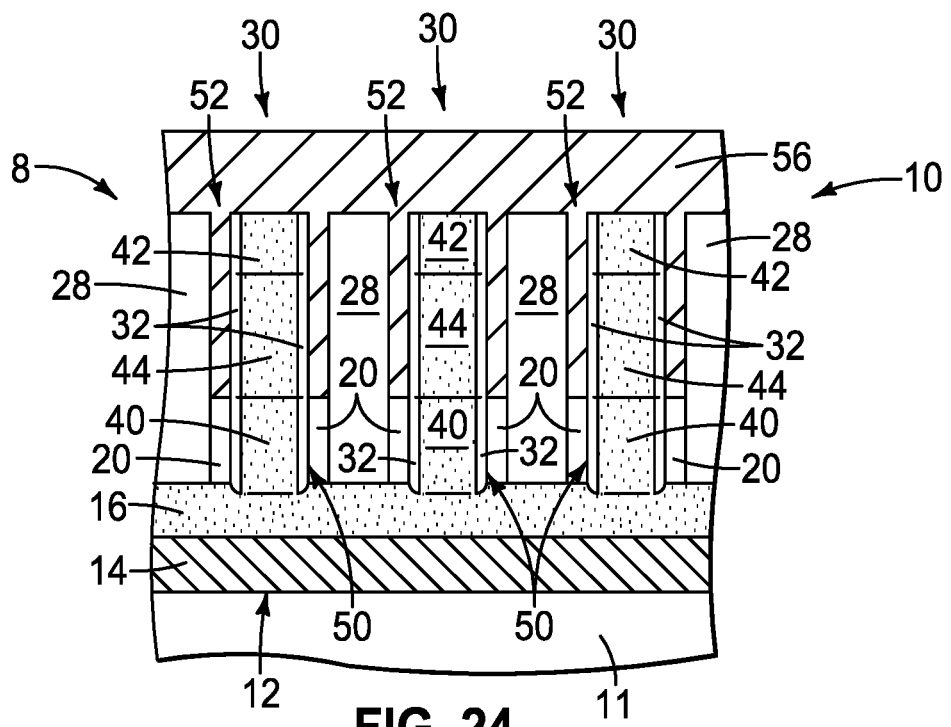
FIG. 24 is view of the FIG. 22 substrate at a processing step subsequent to that shown by FIG. 22 and corresponds to that shown by FIG. 23.
Figure 25:
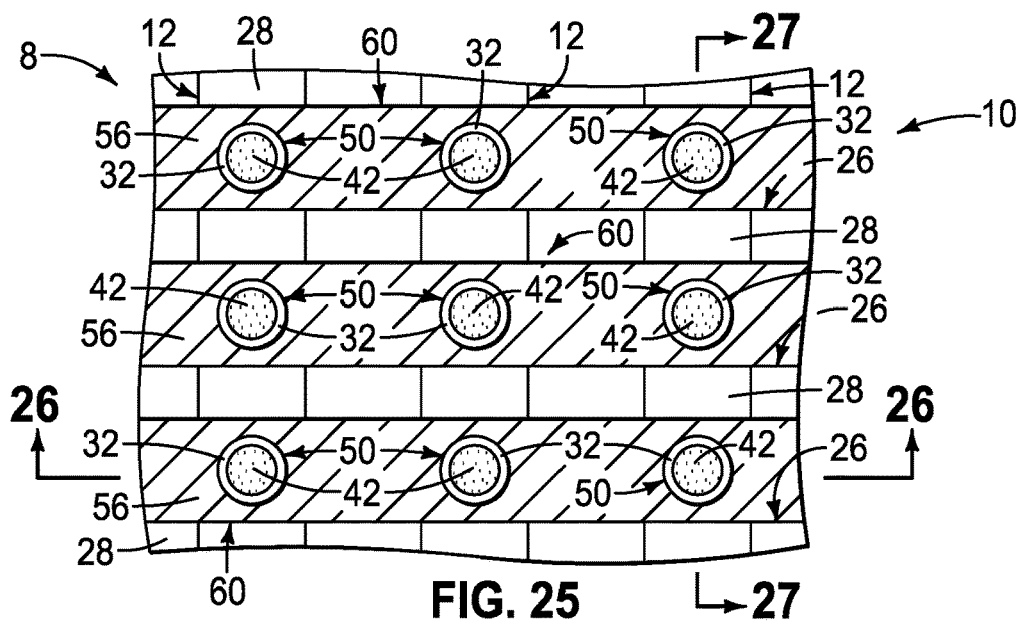
FIG. 25 is top view of the FIG. 23 substrate at a processing step subsequent to that shown by FIG. 23.
Figure 26:
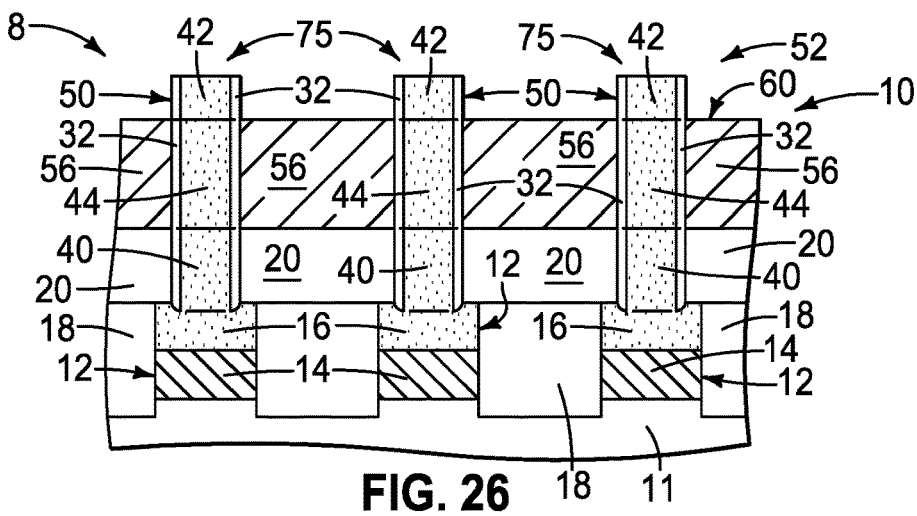
FIG. 26 is a sectional view taken through line 26-26 in FIG. 25.
Figure 27:
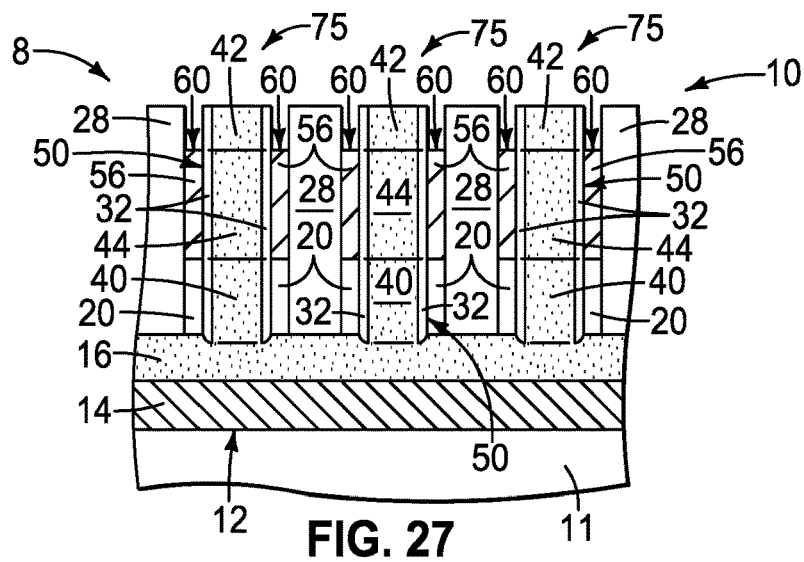
FIG. 27 is a sectional view taken through line 27-27 in FIG. 25.

Referring to FIGS. 18 and 19, transistor material 38 has been removed back at least to elevationally-outermost surfaces of sacrificial material 22, insulator material 28, and gate insulator 32, thereby forming elevationally-extending pillars 50 in openings 30 and which extend elevationally outward of insulative material 20. Such pillars 50 comprise lower source/drain region 40, upper source/drain region 42, channel region 44 elevationally between upper source/drain region 42 and lower source/drain region 40, and gate insulator 32 laterally-outward of channel region 44. In one embodiment, pillars 50 are vertical or within 10° of vertical.

In one embodiment, sacrificial material 22 is replaced with conductive-gate material. In one such embodiment, for example referring to FIGS. 20-22, sacrificial material 22 (not shown) and sacrificial-material lines 24 (not shown) have been removed (e.g., by selective etching) to form gate-line trenches 52 spaced above and crossing lower conductive lines 12 and to leave pillars 50 that extend elevationally outward of insulative material 20. For example, where sacrificial material 22 (not shown) comprises silicon nitride and insulator material 28 and gate insulator 32 comprise an oxide, a wet phosphoric acid etch is an example chemistry that will etch silicon nitride selectively relative to such oxide materials. Thereafter, and in one embodiment, an exposed-outer-side surface of gate insulator 32 of individual elevationally-extending pillars 50 is oxidized (e.g., by exposure to in situ steam generation conditions [ISSG]). Alternately and by way of example only, initial material 32 may be removed and replaced by ISSG exposure of example polysilicon-comprising transistor material 44/22 to form gate insulator 32. Exposure of initial material 32 to oxidizing conditions (e.g., to densify, repair, and grow more material 32) to form a final gate insulator 32 instead of removing and replacing it may be more desirable as less example polysilicon might be consumed (e.g., converted to silicon dioxide). A reason for doing either method would be to repair or overcome presumed damage that occurs to initial material 32 during or by removal of sacrificial material 22. Alternately, in one embodiment, initial material 32 may satisfactorily function as a final gate insulator 32 without subsequent oxidation or any other treatment.

Regardless, and in one embodiment, spaced-conductive gate lines are formed that are individually operatively-laterally-proximate multiple of pillar channel regions 44 laterally aside gate insulator 32, in one embodiment directly there-against, and in one embodiment is conducted in a self-aligned manner. For example, and referring to FIGS. 23 and 24, conductive-gate material 56 (e.g., metal material such as TiN, WN, WSi$_x$, Ru, and/or W) has been formed within and to overfill gate-line trenches 52. Then, referring to FIGS. 25-27 and in one embodiment, conductive-gate material 56 has been removed elevationally-inward to below the tops of pillars 50, thereby forming spaced conductive-gate lines 60 with/from conductive-gate material 56. By way of example only, such may be conducted by chemical mechanical polishing of material 56, followed by a suitable selective wet etch of material 56 relative to other exposed materials. In one embodiment and as shown, conductive-gate material 56 of conductive gate lines 60 completely encircles individual pillars 50. Regardless, transistors 78 have been formed that individually comprise source/drain regions 40, 42, channel region 44, gate insulator 32, and conductive-gate material 56.

Referring to FIGS. 28-30, insulator material 62 (e.g., silicon dioxide and/or silicon nitride) has been formed atop the depicted substrate and planarized back to isolate and leave upper source/drain regions 42 exposed.

Subsequent processing, by way of example only, may include fabrication of capacitors (not shown) that individually have one capacitor electrode (not shown) directly electrically coupled to an individual source/drain region 42 and another capacitor electrode (not shown) that is shared by two or more of such capacitors, for example in dynamic random access memory (DRAM) circuitry and whereby array 10 comprises a memory array. Alternately, and by way of example only, gate insulator 32 may comprise programmable material as described above, with source/drain regions 42 electrically coupling with a conductive sense line there-above and thereby forming a memory array. Alternately, transistors 78 may ultimately be fabricated to not comprise memory cells or circuitry.

Embodiments of the invention also encompass an array of elevationally-extending transistors independent of method of manufacture. However, any of the structural attributes described above with respect to method embodiments may be found in structural aspects of the invention and vice versa. An array (e.g., 10) of elevationally-extending transistors (e.g., 78) in accordance with structural aspects of the invention comprises spaced-lower conductive lines (e.g., 12) comprising conductively-doped-semiconductive material (e.g., 16) extending longitudinally along individual lower conductive lines above metal material (e.g., 14) that extends longitudinally along individual lower conductive lines. Elevationally-extending pillars (e.g., 50) are above and longitudinally-spaced along individual lower conductive lines. The pillars individually comprise a lower source/drain region (e.g., 40) that is directly against conductively-doped-semiconductive material of one of the lower conductive lines. The pillars also comprise an upper source/drain region (e.g., 42) and a channel region (e.g., 44) elevationally between the upper source/drain region and the lower source/ drain region. The pillars also include gate insulator (e.g., 32) laterally-outward of the channel region. Spaced conductive-gate lines (e.g., 60) are individually operatively-laterally proximate multiple of the pillar channel regions laterally aside the gate insulator.

Any other attribute(s) or aspect(s) as shown and/or described herein with respect to other embodiments may be used.

In this document unless otherwise indicated, "elevational", "higher", "upper", "lower", "top", "atop", "bottom", "above", "below", "under", "beneath", "up", and "down" are generally with reference to the vertical direction. "Horizontal" refers to a general direction along a primary substrate surface and may be relative to which the substrate is processed during fabrication, and vertical is a direction generally orthogonal thereto. Further, "vertical" and "horizontal" as used herein are generally perpendicular directions relative one another and independent of orientation of the substrate in three-dimensional space. Additionally, "elevationally-extending" and "extending elevationally" refer to a direction that is angled away by at least 450 from horizontal. Further, "extend(ing) elevationally" and "elevationally-extending" with respect to a field effect transistor are with reference to orientation of the transistor's channel length along which current flows in operation between the source/drain regions. For bipolar junction transistors, "extend(ing) elevationally" and "elevationally-extending" are with reference to orientation of the base length along which current flows in operation between the emitter and collector.

Further, "directly above" requires at least some lateral overlap (i.e., horizontally) of two stated regions/materials/components relative one another. Use of "above" not preceded by "directly" only requires that some portion of the stated region/material/component that is above the other be elevationally outward of the other (i.e., independent of whether there is any lateral overlap of the two stated regions/materials/components).

Any of the materials, regions, and structures described herein may be homogenous or non-homogenous, and regardless may be continuous or discontinuous over any material which such overlie. Further, unless otherwise stated, each material may be formed using any suitable or yet-to-be-developed technique, with atomic layer deposition, chemical vapor deposition, physical vapor deposition, epitaxial growth, diffusion doping, and ion implanting being examples.

Additionally, "thickness" by itself (no preceding directional adjective) is defined as the mean straight-line distance through a given material or region perpendicularly from a closest surface of an immediately-adjacent material of different composition or of an immediately-adjacent region. Additionally, the various materials or regions described herein may be of substantially constant thickness or of variable thicknesses. If of variable thickness, thickness refers to average thickness unless otherwise indicated, and such material or region will have some minimum thickness and some maximum thickness due to the thickness being variable. As used herein, "different composition" only requires those portions of two stated materials or regions that may be directly against one another to be chemically and/or physically different, for example if such materials or regions are not homogenous. If the two stated materials or regions are not directly against one another, "different composition" only requires that those portions of the two stated materials or regions that are closest to one another be chemically and/or physically different if such materials or regions are not homogenous. In this document, a material, region, or structure is "directly against" another when there is at least some physical touching contact of the stated materials, regions, or structures relative one another. In contrast, "over", "on", "adjacent", "along", and "against" not preceded by "directly" encompass "directly against" as well as construction where intervening material(s), region(s), or structure(s) result(s) in no physical touching contact of the stated materials, regions, or structures relative one another.

Herein, regions-materials-components are "electrically coupled" relative one another if in normal operation electric current is capable of continuously flowing from one to the other, and does so predominately by movement of subatomic positive and/or negative charges when such are sufficiently generated. Another electronic component may be between and electrically coupled to the regions-materials-components. In contrast, when regions-materials-components are referred to as being "directly electrically coupled", no intervening electronic component (e.g., no diode, transistor, resistor, transducer, switch, fuse, etc.) is between the directly electrically coupled regions-materials-components.

Additionally, "metal material" is any one or combination of an elemental metal, a mixture or an alloy of two or more elemental metals, and any conductive metal compound.

Further, a "self-aligned manner" means a technique whereby at least a lateral surface of a structure is defined by deposition of material against a sidewall of a previously-patterned structure, and in some embodiments is with respect to an opposing pair of lateral surfaces or edges, thereby not requiring subsequent photolithographic or other mask-based processing with respect to such lateral surface(s) or edge(s).

In this document, a selective etch or removal is an etch or removal where one material is removed relative to another stated and/or exposed material or materials at a rate of at least 2.0:1.

CONCLUSION

In some embodiments, a method used in forming an array of elevationally-extending transistors comprises forming spaced lower conductive lines over a substrate. A gate insulator is formed in openings that are individually directly above individual of the lower conductive lines. The openings are formed into laterally-spaced lines comprising sacrificial material and are spaced longitudinally there-along. Channel material is formed in the individual openings laterally adjacent the gate insulator and is electrically coupled to the individual lower conductive line there-below. The sacrificial material is replaced with conductive-gate material.

In some embodiments, a method used in forming an array of elevationally-extending transistors comprises forming spaced lower conductive lines over a substrate. Spaced sacrificial-material lines are formed above and crossing the lower conductive lines. Insulator material is formed in longitudinally-extending trenches between immediately-adjacent of the sacrificial-material lines. Openings are formed into the sacrificial-material lines directly above individual of the lower conductive lines. The openings are longitudinally-spaced along the individual lower conductive lines. Elevationally-extending pillars are formed in the openings. The pillars individually comprise a lower source/drain region directly electrically coupled to one of the lower conductive lines, an upper source/drain region, a channel region elevationally between the upper source/drain region and the lower source/drain region, and a gate insulator laterally-outward of the channel region. The sacrificial-material lines are removed to form gate-line trenches spaced above and crossing the lower conductive lines. Conductive-gate material is formed within and overfills the gate-line trenches. The conductive-gate material is removed elevationally inward to below tops of the pillars and spaced conductive-gate lines are formed with the conductive-gate material. The conductive-gate lines individually are operatively-laterally proximate multiple of the pillar channel regions laterally aside the gate insulator.

In some embodiments, a method used in forming an array of elevationally-extending transistors comprises forming spaced lower conductive lines over a substrate. The lower conductive lines individually comprise conductively-doped-semiconductive material extending longitudinally along the individual lower conductive line above and directly against metal material that extends longitudinally along the individual lower conductive line. Insulative material is formed above and laterally between the lower conductive lines. Spaced sacrificial-material lines are formed above the insulative material. The sacrificial-material lines cross above the lower conductive lines. Insulator material is formed in longitudinally-extending trenches between immediately-adjacent of the sacrificial-material lines. Openings are formed through the sacrificial-material lines and through the insulative material to individual of the lower conductive lines. The openings are longitudinally-spaced along and are individually completely surrounded by sacrificial material of the individual sacrificial-material lines. A gate insulator is formed in individual of the openings along sidewalls and a base of the individual openings. A sacrificial liner is formed within the individual openings laterally over inner sidewalls of and laterally across a base of the gate insulator. Etching is conducted through a base of the sacrificial material and the base of the gate insulator to the individual lower conductive lines. The sacrificial liner is removed and transistor material is formed within the openings. The transistor material comprises a lower source/drain region that is directly against the conductively-doped-semiconductive material of one of the individual lower conductive lines, an upper source/drain region, and a channel region elevationally between the upper source/drain region and the lower source/drain region. The sacrificial-material lines are removed to form gate-line trenches spaced above and crossing the lower conductive lines and to leave pillars that extend elevationally outward of the insulative material. The elevationally-extending pillars individually comprise the lower source/drain region, the upper source/drain region, the channel region, and the gate insulator. An exposed-outer-side surface of the gate insulator of individual of the elevationally-extending pillars is oxidized. Spaced conductive-gate lines that are individually operatively-laterally proximate multiple of the pillar channel regions laterally aside the gate insulator are formed in a self-aligned manner. The self-aligned manner comprises forming metal material within and to overfill the gate-line trenches. Timed-etching is conducted of the metal material elevationally inward to below tops of the pillars.

In some embodiments, an array of elevationally-extending transistors comprises spaced lower conductive lines individually comprising conductively-doped-semiconductive material extending longitudinally along the individual lower conductive line above metal material that extends longitudinally along the individual lower conductive line. Elevationally-extending pillars are above and longitudinally-spaced along the individual lower conductive line. The pillars individually comprise a lower source/drain region that is directly against the conductively-doped-semiconductive material of one of the lower conductive lines, an upper source/drain region, a channel region elevationally between the upper source/drain region and the lower source/drain region, and a gate insulator laterally-outward of the channel region. Spaced conductive-gate lines are individually operatively-laterally proximate multiple of the pillar channel regions laterally aside the gate insulator.

In compliance with the statute, the subject matter disclosed herein has been described in language more or less specific as to structural and methodical features. It is to be understood, however, that the claims are not limited to the specific features shown and described, since the means herein disclosed comprise example embodiments. The claims are thus to be afforded full scope as literally worded, and to be appropriately interpreted in accordance with the doctrine of equivalents.

The invention claimed is:

1. A method used in forming an array of elevationally-extending transistors, comprising:
    forming spaced lower conductive lines over a substrate;
    forming a gate insulator in openings that are individually directly above individual of the lower conductive lines, the openings being formed into laterally-spaced lines comprising sacrificial material and being spaced longitudinally there-along;
    forming channel material in the individual openings laterally adjacent the gate insulator and electrically coupled to the individual lower conductive line there-below; and
    replacing the sacrificial material with conductive-gate material.

2. The method of claim 1 comprising forming and removing a sacrificial liner within the openings over sidewalls of the gate insulator prior to forming the channel material.

3. The method of claim 1 wherein the replacing comprises removing the sacrificial material before forming the conductive-gate material in place thereof, and further comprising oxidizing the gate insulator after the removing of the sacrificial material and before the forming of the conductive-gate material.

4. The method of claim 3 wherein the oxidizing comprises exposure of the gate insulator to steam.

5. The method of claim 1 comprising forming the openings to extend to the individual lower conductive lines before forming the gate insulator.

6. The method of claim 1 comprising forming insulative material that is elevationally between the sacrificial-material lines and the lower conductive lines, the openings extending into the insulative material.

7. The method of claim 1 wherein the channel material is electrically coupled to the individual lower conductive line there-below through conductively-doped-semiconductive material that is directly above said individual lower conductive line there-below.

8. A method used in forming an array of elevationally-extending transistors, comprising:
    forming spaced lower conductive lines over a substrate;
    forming spaced sacrificial-material lines above and crossing the lower conductive lines;
    forming insulator material in longitudinally-extending trenches between immediately-adjacent of the sacrificial-material lines;
    forming openings into the sacrificial-material lines directly above individual of the lower conductive lines, the openings being longitudinally-spaced along the individual lower conductive lines;

forming elevationally-extending pillars in the openings, the pillars individually comprising:
  a lower source/drain region directly electrically coupled to one of the lower conductive lines;
  an upper source/drain region;
  a channel region elevationally between the upper source/drain region and the lower source/drain region; and
  a gate insulator laterally-outward of the channel region;
removing the sacrificial-material lines to form gate-line trenches spaced above and crossing the lower conductive lines;
forming conductive-gate material within and to overfill the gate-line trenches; and
removing the conductive-gate material downward to below tops of the pillars and forming spaced conductive-gate lines with the conductive-gate material, the conductive-gate lines individually being operatively-laterally proximate multiple of the pillar channel regions laterally aside the gate insulator.

9. The method of claim 8 wherein the sacrificial material of the sacrificial-material lines is insulative.

10. The method of claim 8 wherein the sacrificial material of the sacrificial-material lines is not insulative.

11. The method of claim 8 comprising forming the conductive-gate lines in a self-aligned manner.

12. The method of claim 8 comprising forming the lower conductive lines to individually comprise conductively-doped-semiconductive material extending longitudinally along the individual lower conductive line above metal material that extends longitudinally along the individual lower conductive line.

13. The method of claim 12 wherein the conductively-doped-semiconductive material is formed directly against the metal material.

14. The method of claim 8 wherein the conductive-gate material of the conductive-gate lines completely encircles the individual pillars.

15. A method used in forming an array of elevationally-extending transistors, comprising:
  forming spaced lower conductive lines over a substrate, the lower conductive lines individually comprising conductively-doped-semiconductive material extending longitudinally along the individual lower conductive line above and directly against metal material that extends longitudinally along the individual lower conductive line;
  forming insulative material above and laterally between the lower conductive lines;
  forming spaced sacrificial-material lines above the insulative material, the sacrificial-material lines being above and crossing the lower conductive lines;
  forming insulator material in longitudinally-extending trenches between immediately-adjacent of the sacrificial-material lines;
  forming openings through the sacrificial-material lines and through the insulative material to individual of the lower conductive lines, the openings being longitudinally-spaced along and individually completely surrounded by sacrificial material of the individual sacrificial-material lines;
  forming a gate insulator in individual of the openings along sidewalls and a base of the individual openings;
  forming a sacrificial liner within the individual openings laterally over inner sidewalls of and laterally across a base of the gate insulator;
  etching through a base of the sacrificial liner and the base of the gate insulator to the individual lower conductive lines;
  removing the sacrificial liner and forming transistor material within the openings, the transistor material comprising:
    a lower source/drain region that is directly against the conductively-doped-semiconductive material of one of the individual lower conductive lines;
    an upper source/drain region; and
    a channel region elevationally between the upper source/drain region and the lower source/drain region;
  removing the sacrificial-material lines to form gate-line trenches spaced above and crossing the lower conductive lines and to leave pillars that extend upward of the insulative material; the elevationally-extending pillars individually comprising the lower source/drain region, the upper source/drain region, the channel region, and the gate insulator;
  oxidizing an exposed-outer-side surface of the gate insulator of individual of the elevationally-extending pillars; and
  forming spaced conductive-gate lines that are individually operatively-laterally proximate multiple of the pillar channel regions laterally aside the gate insulator in a self-aligned manner, the self-aligned manner comprising:
    forming metal material within and to overfill the gate-line trenches; and
    timed-etching the metal material downward to below tops of the pillars.

16. The method of claim 15 wherein the lower source/drain region comprises conductively-doped-semiconductive material, and that is of the same composition as that of the conductively-doped-semiconductive material of the one lower conductive line.

* * * * *